Inventor
H. Banasiewicz
By Glascock Downing & Seebold
Attys.

3,032,722

TRANSISTOR OSCILLATORS AND CAPACITY SENSITIVE CIRCUITS COMPRISING SUCH OSCILLATORS

Henryk Banasiewicz, London, England, assignor to Fielden Electronics Limited, Manchester, England, a British company Filed Dec. 1, 1958, Ser. No. 777,338
Claims priority, application Great Britain Dec. 5, 1957
5 Claims. (Cl. 331—110)

This invention relates to transistor oscillators and to capacity sensitive circuits comprising such oscillators.

It is known to provide a thermionic valve oscillator having a bridge connected oscillatory circuit consisting of a first and a second capacitative element and an inductive element connected in series in a closed loop the common connection of the capacitative elements and a tapping on the inductive element forming the output terminals of the bridge and a valve having its input circuit connected between the output terminals of the bridge and its output circuit connected to one element of the bridge whereby when the bridge is on one side of the balance the energy supplied to said one element induces oscillations and when the bridge is on the other side of balance the oscillator is quiescent.

Such an oscillator reaches the threshold of oscillation, that is, the condition at which oscillation just commences, when the positive feedback to the input circuit of the valve via one parallel path through the bridge between output terminals of the bridge exceeds by a sufficient margin the negative feedback to the input circuit of the valve via the other parallel path through the bridge between the output terminals.

Oscillators of this known kind are used for the purpose of detecting when a variable element of the bridge attains a predetermined magnitude, the oscillator being arranged to reach the threshold of oscillation when that variable element attains the predetermined magnitude.

It is well known that the thermionic valve in the known oscillator referred to above may be replaced by a transistor. If this is done, however, it is found that the threshold of oscillation is dependent not only upon the magnitude of the elements of the bridge but also upon the temperature of the transistor and the potentials applied to the transistor electrodes.

The object of the invention is, accordingly, to provide an oscillator having a transistor as the amplifying element in which the attainment of the threshold of oscillation is accurately related to the magnitudes of the elements of the bridge.

It can be shown that as the gain of the combination of the transistor and the bridge increases the threshold of oscillation becomes more accurately related to the magnitudes of the elements of the bridge. The gain of this combination is, however, limited by, inter alia, the internal impedance of the bridge measured between its output terminals, this impedance being analogous to the internal impedance of a generator supplying exciting current to the input circuit of the transistor. The object of the invention is, accordingly, achieved by reducing the effect of the internal impedance of the bridge.

According to the invention, in a transistor oscillator having a bridge connected oscillatory circuit consisting of a first and a second capacitative element and an inductive element connected in series in a closed loop, the common connection of the capacitative elements and a tapping on the inductive element forming the output terminals of the bridge and a transistor having its input circuit connected between the output terminals of the bridge and its output circuit connected to one element of the bridge whereby the bridge is on one side of balance the energy supplied to said one element induces oscillations and when the bridge is on the other side of balance the oscillator is quiescent a second inductor is connected in series with the input circuit only of the transistor across the output terminals of the bridge, the reactance of the second inductor being substantially equal to the capacitative reactance of the bridge measured at the output terminals.

In order to assist in the full understanding of the invention it is pointed out that the invention is not applicable in the field of thermionic valve oscillators. There are two reasons for this. Firstly, the threshold of oscillation of a thermionic valve oscillator is substantially unaffected by ambient temperature; and secondly, no substantial increase in gain of a valve oscillator could be achieved by reducing the effect of the internal impedance of the bridge because the input impedance of a valve is very high. By contrast, the utility of the invention in the field of transistor oscillators is dependent upon the fact that the impedance of the input circuit of a transistor is low.

Two embodiments of the invention will now be described by way of example, with reference to the accompanying drawing, of which:

In the figures corresponding circuit elements are indicated by the same reference numeral.

Figure 1:
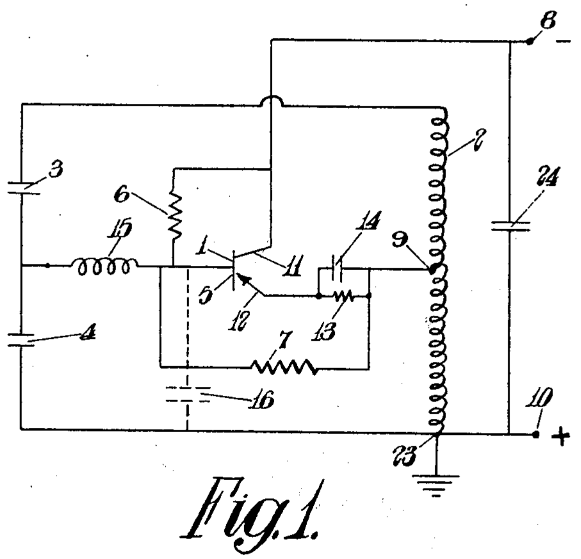
FIGURE 1 shows a transistor oscillator.

In the arrangement shown in FIGURE 1 the transistor oscillator comprises a transistor 1 of p-n-p type and an oscillatory circuit comprising a centre-tapped inductance 2 of value L henrys and two capacitances 3 and 4 the ratio between which is variable. The inductance is so constructed that the coupling factor between the two portions situated on either side of the tapping point 9 is substantially unity. The mean potential of the base electrode 5 of the transistor 1 is maintained at a suitable value in known manner by connecting that electrode to the common connection between two resistances 6 and 7 which together constitute a potential divider connected between the negative terminal 8 of an electrical source and the tapping point 9 on the inductance 2, one end of the inductance 2 being connected to the positive terminal 10 of the electrical source. The collector electrode 11 of the transistor 1 is connected to the negative terminal 8 of the source and the emitter electrode 12 is connected to the tapping point 9 through a resistance 13 which is shunted by a capacitance 14. The capacitance 14 ensures that the emitter electrode 12 is effectively connected, so far as oscillatory current is concerned, directly to the tapping point 9. A capacitance 24 connected between the terminals 8 and 10 of the electrical source ensures that the collector electrode is effectively connected, so far as oscillatory current is concerned, directly to the terminal 23 of the inductance 2 which is connected to the positive terminal 10. The resistance 13 co-operates with the resistances 6 and 7 to stabilise the direct current working point of the transistor in known manner.

An inductance 15 is connected between the common connection of the capacitances 3 and 4 and the base electrode 5.

In operation, oscillation occurs when the ratio between the capacitances 3 and 4 differs slightly from unity in an appropriate direction. Then any change in the current flowing in the collector-emitter circuit of the transistor 1 results in a change of current flowing between terminal 23 and tapping point 9 of inductor 2. Since the coupling factor between the two halves of the inductor 2 is substantially unity this change in current flowing between terminal 23 and tapping point 9 induces substantially equal voltage in the two halves of inductor 2, these equal voltages being in phase so far as the end 23 of the inductor 2 is concerned. So far as the tapping point 9 is concerned, however, these voltages are in antiphase and as the capacitances 3 and 4 are approximately equal the impedances of the two parallel paths of the bridge between tapping point 9 and the junction of capacitances 3 and 4 are approximately equal and the resulting currents flowing in the two paths are approximately equal but in antiphase, one being in the phase to produce positive feedback and the other being in the phase to produce negative feedback to the base electrode of the transistor. Oscillation commences when the ratio of the capacitances 3 and 4 differs from unity sufficiently and in a direction appropriate to cause this positive feedback to exceed this negative feedback by an amount just sufficient to cause the circuit to reach the threshold of oscillation. Under these conditions each of the capacitances 3 and 4 can be considered as having a value of approximately C farads.

It can be shown that as the gain of the combination of the transistor 1 and the bridge 2, 3, 4 increases the threshold of oscillation becomes more accurately related to the ratio of the capacitances 3 and 4. The gain of the combination is increased by reducing the effect of the internal impedance of the bridge and this reduction is achieved by means of the inductance 15.

As the capacitances 3 and 4 are connected in series in the oscillatory circuit they have the same effect in that circuit as a single capacitance of approximately ½ C farads. Furthermore, their combined reactance at the frequency of oscillation is equal in magnitude to that of the inductance 2 of L henrys. The internal impedance of the bridge measured between its output terminals, that is, between the common connection of the capacitance 3 and 4 and the tapping point 9 is, however, approximately 2 C farads. This is because the current divides at the tapping 9 substantially equally between the two halves of the inductance 2 and the coupling factor between these two halves is substantially unity with the result that the ends of inductance 2 appear to be short circuited when viewed from the output terminals of the bridge. It follows that, in order to cancel this impedance at the frequency of oscillation the inductance 15 must have a value of ¼ L henrys. In practice the optimum value is somewhat greater than this, that is, 27½ to 30 percent of that of the winding, due to the effect of, amongst other things, of the capacitance of the base-emitter junction.

The provision of the inductance 15 has another advantage in that it renders the balance condition of the bridge less sensitive to variation of the capacitance of the base-collector junction resulting from variation in the potential across terminals 6 and 10. As explained above, due to the presence of the capacitance 24, the collector electrode 11 is effectively connected, so far as oscillatory current is concerned, to the terminal 23 with the result that the base-collector junction is effectively connected between the base electrode 5 and terminal 23 as indicated by the capacitance 16 shown in broken lines in FIGURE 1. In the absence of inductance 15, therefore, the base-collector junction is connected, so far as oscillatory current is concerned, in parallel with the capacitance 4. With the inductance 15 included in the circuit, however, the oscillatory potential appearing across this inductance is large compared with that appearing across the base-emitter junction. The capacitance 16 may, therefore, be simulated to a close approximation by connecting a capacitance of equal magnitude between tapping point 9 and terminal 23. As, however, the coupling factor between the two portions of inductance 2 is substantially unity the effect of connecting a capacitance between tapping point 9 and terminal 23 is equivalent to connecting two capacitances of equal magnitude each in parallel with one portion of inductance 2. It follows that any variation in the base-collector capacitance is without substantial effect upon the balance condition of the bridge.

If the inductance 2 were tapped otherwise than at its mid point the two capacitances 3 and 4 would be more unequal and the value of the inductance 15 would be altered accordingly.

If the coupling factor between the two portions of the tapped inductance 2 departs substantially from unity the value of the inductance 15 would need to be modified to take into account the leakage inductances of inductance 2.

Figure 2:
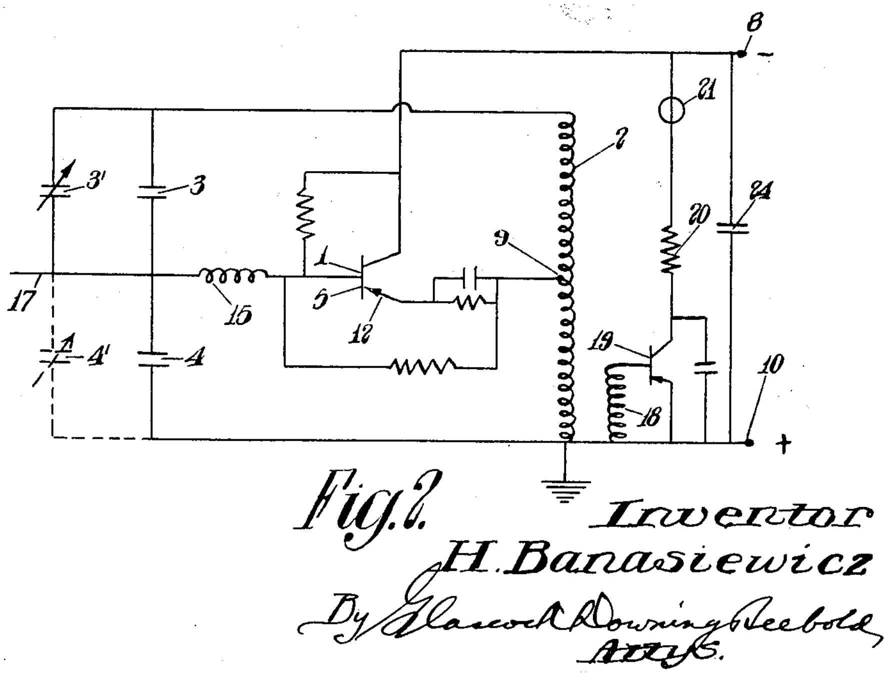
FIGURE 2 shows a capacity-sensitive circuit incorporating the transistor oscillator shown in FIGURE 1.

FIGURE 2 shows a capacity-sensitive circuit which incorporates the oscillator shown in FIGURE 1. In this arrangement an electrode or probe 17 is connected to the common connection between the capacitances 3 and 4 so that it has the same effect in the circuit as an equivalent capacitance $4^1$ connected in parallel with the capacitance 4. A small trimming capacitance $3^1$ is connected in parallel with the capacitance 3.

The inductance 2 is inductively coupled to an inductance 18 connected between the base and emitter electrode of a second transistor 19 the collector electrode of which is connected to the negative terminal 8 through a resistance 20 and an indicating or control device 21. When the oscillatory circuit is oscillating, therefore, the oscillatory current flowing in the inductance 2 induces a corresponding current in the inductance 18 which is rectified and amplified by the transistor 19. A direct current therefore flows through the indicating or control device 21 the magnitude of which is dependent upon the amplitude of oscillation in the oscillatory circuit.

The arrangement shown in FIGURE 2 may be used as a capacity-sensitive proximity switch, the state of oscillation or non-oscillation being dependent upon the distance of an object from the electrode 17. Variation of this distance varies the magnitude of the capacitance $4^1$ and the resulting change in the amplitude of oscillation in the oscillatory circuit produces a corresponding change in the direct current flowing through the indicating or control device 21. The trimming capacitance 3 is used to adjust the zero of the indicator or the set point of the control device as the case may be.

In a modification of the arrangement shown in FIGURE 2 a relatively large capacitance may be connected in series with inductance 15 for the purpose of removing from the electrode 17 the unidirectional potential of the base electrode 5.

In the arrangements described above the transistor 1 may, alternatively, be connected so that its base electrode 5 is connected via the inductance 15 to the tapping point 9 on the inductance 2 and the emitter electrode 12 is effectively connected, so far as oscillatory current is concerned to the common connection of the two capacitance arms 3, $3^1$ and 4, $4^1$ of the oscillatory circuit. In that event, however, appropriate means must be provided for connecting the positive terminal 10 of the electrical source to this common connection.

In the arrangements described above the transistor is so connected that its emitter electrode is common to both the input and output circuits of the transistor. Alternatively, the transistor may be so connected that its base or its collector electrode is common to both those circuits, the circuit arrangement being modified in a manner which will be apparent to those skilled in the art, the coil 15 being connected in series with the input circuit of the transistor so that it is traversed only by the exciting current flowing between the output terminals of the bridge.

Also in the arrangements described above the polarity of the source is that which is appropriate for a p-n-p type transistor. For a transistor of n-p-n type the polarity of the source must be reversed.

Also, the capacitance 24 may be removed if the impedance of the source connected to the terminals 8 and 10 is sufficiently low at the frequency of oscillation.

What I claim is:

1. An oscillatory circuit including a transistor, an inductive winding having an intermediate tapping point, a pair of capacitances, one of which is variable, said capacitances and winding all being connected in series to form a circuit which is resonant at a predetermined frequency at a predetermined value of the variable capacitance, reactive means coupling the signal input electrodes of the transistor between the common junction of the capacitances and the tapping point of the winding, a direct current source connected between the other electrode of the transistor and one end of the winding to provide an output current path through one input electrode of the transistor and one portion of the winding, the reactive means comprising an inductance having a value of reactance to cancel the capacitive reactance of the circuit at the predetermined frequeny as measured between the common junction of the capacitances and the tapping point of the winding, said inductance being connected between said common junction and the other signal input electrode of the transistor.

2. A transistor oscillator according to claim 1 wherein said tapping is at the mid point of said winding and the value of the inductance is approximately 27½ to 30 percent of that of said winding.

3. A transistor oscillator according to claim 1 wherein said one input electrode is the emitter electrode.

4. A circuit as defined in claim 1 in which said variable capacitance comprises a fixed capacitor and an electrode connected to the common junction and forming with one terminal of the inductance a parallel connected capacity dependent on the proximity of an object therebetween, rectifier means having its input coupled to the oscillatory circuit and providing at its output a current dependent on the amplitude of oscillations, and means coupled to the output of the rectifier responsive to the magnitude of the output current.

5. A circuit according to claim 4 wherein an adjustable capacitor is connected in parallel with the other of said two capacitors.

References Cited in the file of this patent

UNITED STATES PATENTS

| | | |
|---|---|---|
| 1,863,798 | Kummerer | June 21, 1932 |
| 2,764,643 | Sulzer | Sept. 25, 1956 |
| 2,889,496 | Moore | June 2, 1959 |